United States Patent
Huang et al.

(10) Patent No.: US 10,216,879 B1
(45) Date of Patent: Feb. 26, 2019

(54) METHOD FOR ESTABLISHING AGING MODEL OF DEVICE AND ANALYZING AGING STATE OF DEVICE WITH AGING MODEL

(71) Applicant: Taiwan Semiconductor Manufacturing Co., Ltd., Hsinchu (TW)

(72) Inventors: Yi-Shun Huang, Hsinchu (TW); Wai-Kit Lee, Hong Kong (HK); Ya-Chin Liang, Tainan (TW); Cheng Hsiao, Hsinchu (TW); Juan-Yi Chen, Hsinchu (TW); Li-Chung Hsu, Hsinchu (TW); Ting-Sheng Huang, Hsinchu County (TW); Ke-Wei Su, Hsinchu County (TW); Chung-Kai Lin, Taipei (TW); Min-Chie Jeng, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/682,863

(22) Filed: Aug. 22, 2017

(51) Int. Cl.
*G06F 17/50* (2006.01)
*G06F 17/30* (2006.01)
*H01L 21/66* (2006.01)

(52) U.S. Cl.
CPC .... *G06F 17/5036* (2013.01); *G06F 17/30294* (2013.01); *G06F 17/5009* (2013.01); *H01L 22/30* (2013.01)

(58) Field of Classification Search
CPC . G06F 17/30294; G06F 17/5009; H01L 22/30
USPC .......... 716/110, 111, 112, 136, 138
See application file for complete search history.

(56) References Cited

U.S. PATENT DOCUMENTS

| | | | |
|---|---|---|---|
| 7,219,045 B1* | 5/2007 | Wu et al. | G06F 17/5036 703/14 |
| 7,292,968 B2 | 11/2007 | Wu et al. | |
| 8,756,559 B2* | 6/2014 | Shroff et al. | G06F 17/5009 716/106 |
| 9,236,748 B2* | 1/2016 | Barsukov et al. | H02J 7/00 |
| 9,250,645 B2* | 2/2016 | Chadwick et al. | G06F 13/20 |
| 2014/0062415 A1* | 3/2014 | Barsukov et al. | H02J 7/00 320/134 |
| 2016/0124052 A1* | 5/2016 | Inguva et al. | G01R 31/3679 324/431 |
| 2017/0103154 A1* | 4/2017 | Jeon et al. | G06F 17/5036 |

OTHER PUBLICATIONS

Jeng, M.C., et al.; "Circuit Reliability Simulation Using TMI2;" IEEE; 2013; pp. 1-7.

\* cited by examiner

*Primary Examiner* — Sun Lin
(74) *Attorney, Agent, or Firm* — McClure, Qualey & Rodack, LLP

(57) ABSTRACT

A method for establishing an aging model of a device is provided. The device is measured to obtain degradation information of the device under an operating condition, wherein the device is a physical device. The degradation information is partitioned into a permanent degradation portion and an impermanent degradation portion. The impermanent degradation portion is differentiated by time to obtain a differential value. The aging model is obtained according to the differential value. When the differential value is greater than zero, a degradation of the device increases over time, and when the differential value is less than zero, the degradation of the device decreases over time.

20 Claims, 10 Drawing Sheets

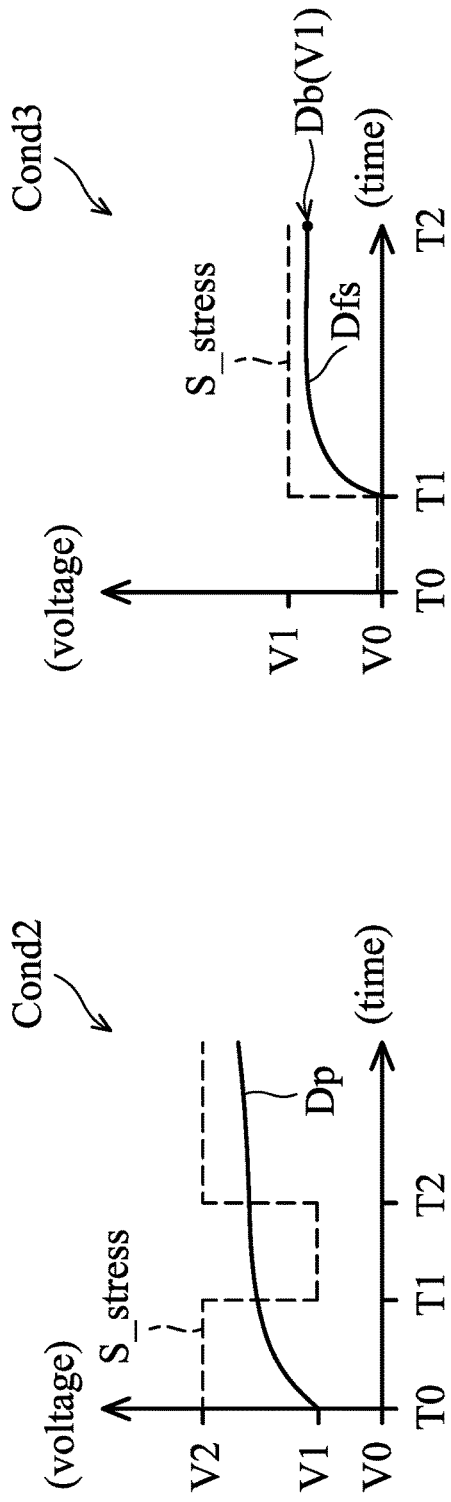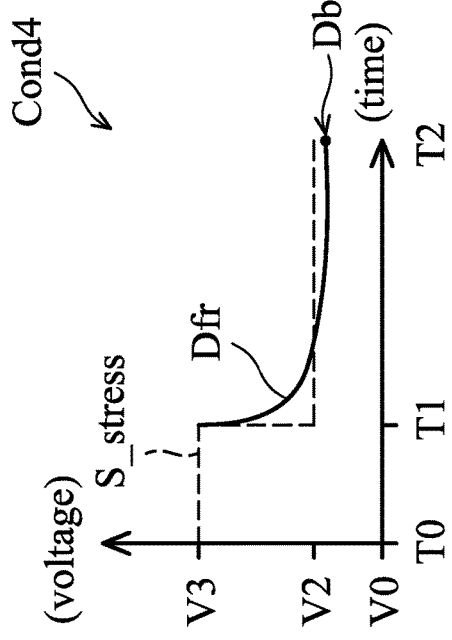

METHOD FOR ESTABLISHING AGING MODEL OF DEVICE AND ANALYZING AGING STATE OF DEVICE WITH AGING MODEL

BACKGROUND

System-on-chip (SoC) technology is integrating multiple functional blocks on a single silicon chip. The multiple functional blocks may include digital circuits, analog circuits, mixed-signal circuits or any combination thereof. This technology reduces the development cycle and manufacturing costs while increasing product reliability, functionality and performance.

As semiconductor devices advance to submicron sizes, integrated circuit design margins have become very small. Therefore, a proper estimate of aging-induced defects will help designers optimize design margins so as to achieve a balance between reliability and cost. Simulation tools such as Simulation Program with Integrated Circuits Emphasis (SPICE) can be used to simulate aging-induced defects. However, it is not widely known how degradation mechanisms propagate in a SoC chip as a function of a variety of operating conditions. Thus, an aging model is needed to predict semiconductor degradation.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 3A shows an exemplified diagram illustrating the unrecoverable degradation of a device, and the unrecoverable degradation is obtained according to the degradation information under a second operating condition, in accordance with some embodiments of the disclosure.

FIG. 3B shows an exemplified diagram illustrating the stress degradation of the recoverable degradation, and the stress degradation is obtained according to the degradation information of a device under a third operating condition, in accordance with some embodiments of the disclosure.

FIG. 3C shows an exemplified diagram illustrating the recovery degradation of the recoverable degradation, and the recovery degradation is obtained according to the degradation information of a device under a fourth operating condition, in accordance with some embodiments of the disclosure.

DETAILED DESCRIPTION

Figure 1:
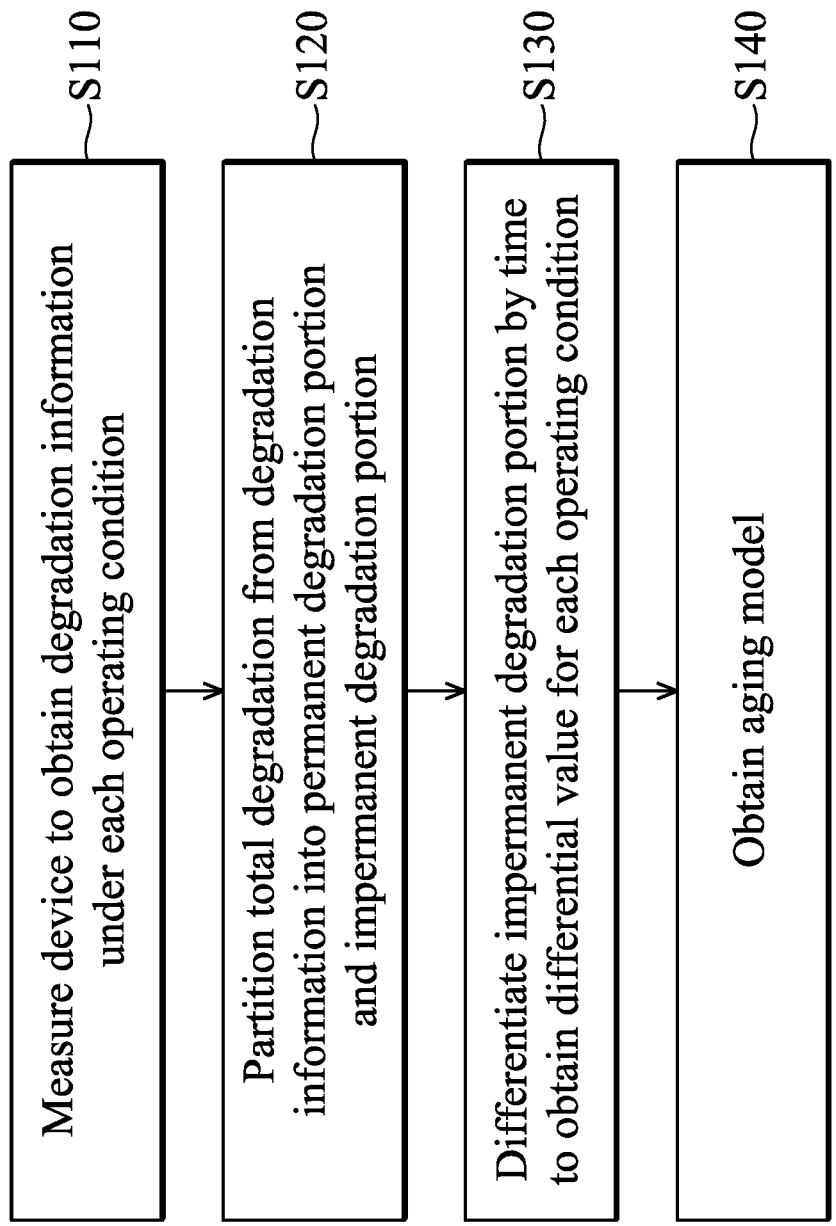
FIG. 1 shows a simplified flowchart illustrating a method for establishing an aging model of a device, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

In the design of integrated circuits (ICs), designers can simulate the performance of the ICs that are being designed. Various simulation tools are available for simulating the performance of the ICs. For example, Simulation Program with Integrated Circuit Emphasis (SPICE) is a simulation tool designed for this task. Such simulation tools simulate the electrical behavior of the ICs according to model parameters. In general, the model parameters are provided by wafer fabrication facility (FAB).

IC (e.g., SoC chip) is relatively complicated, and a complicated IC having various types of functional blocks or circuits demands a thorough reliability analysis before going through an expensive and time-consuming fabrication process. Semiconductor aging has emerged as a major factor of an IC's reliability. Aging-induced defects may include Hot Carrier Injection (HCI), Electron-Migration (EM), Bias Temperature Instability (BTI), and/or Time Dependent Dielectric Breakdown (TDDB).

HCI relates to the change of electrons/holes' mobility. EM relates to the gradual displacement of the ions in a conductor as a result of the current flowing through the conductor. BTI relates to a shift of a threshold voltage of a transistor. TDDB refers to the damage accumulated in the gate oxide region of a transistor. Specifically, HCI, EM, NBTI and TDDB are the mechanisms of device degradation due to aging effects.

FIG. 1 shows a simplified flowchart illustrating a method for establishing an aging model of a device, in accordance with some embodiments of the disclosure. In some embodiments, the method of FIG. 1 is performed by a processor capable of executing a simulation tool.

In operation S110, a device is measured under an operating condition, so as to obtain degradation information, and the measured device is a physical device. The device is implemented according to multiple semiconductor processes with various process parameters. In some embodiments, the process parameters are provided by a wafer fabrication facility for fabricating the device. In some embodiments, the device is an active or passive component (e.g., a MOS transistor, a resistor, a capacitor, etc.) that forms the circuit (e.g., a digital circuit, an analog circuit, a memory circuit, etc.) of an IC.

After obtaining the degradation information of the device (in operation S110), total degradation Dt is obtained or extracted from the degradation information, and the total degradation Dt is partitioned into a permanent degradation portion and an impermanent degradation portion (operation S120). For the total degradation Dt, the permanent degradation portion includes an unrecoverable degradation Dp for the device, and the impermanent degradation portion includes a recoverable degradation Df, i.e. Dt=Dp+Df.

Figure 2:
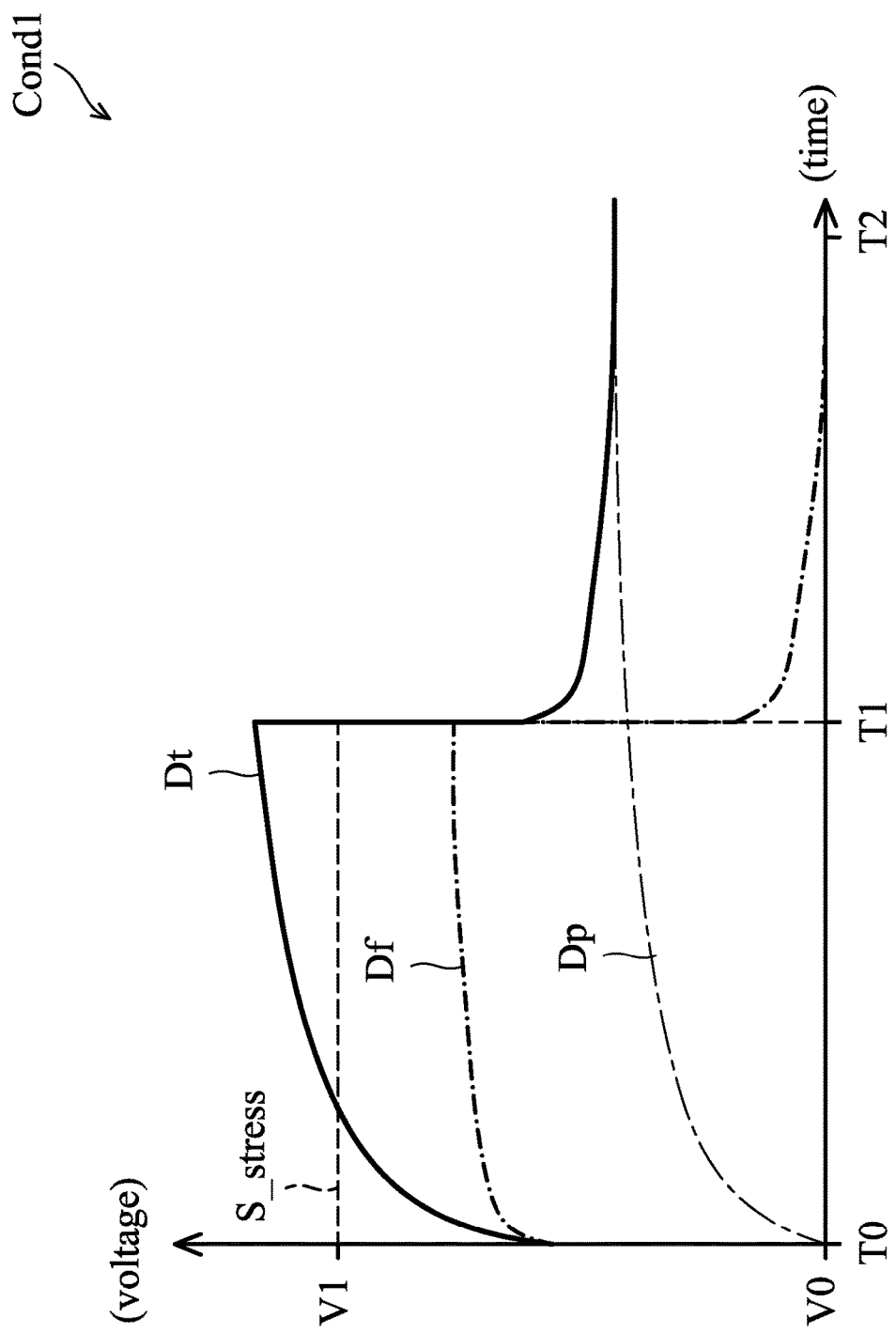
FIG. 2 shows an exemplified diagram illustrating the degradation information of a device under a first operating condition, in accordance with some embodiments of the disclosure.

FIG. 2 shows an exemplified diagram illustrating the degradation information of a device under a first operating condition Cond1, in accordance with some embodiments of the disclosure. In the first operating condition Cond1, a stressing signal S_stress with a voltage value V1 is applied to the device from time T0 to time T1, and then the stressing signal S_stress with a voltage value V0 is applied to the device after time T1. The voltage value V1 is greater than the voltage value V0. In response to the stressing signal S_stress, the device is measured and the degradation information is obtained. For example, the device is a MOS transistor having a width W1 and a length L1, and the current or other characteristics of the MOS transistor is measured by a test apparatus when the test apparatus applies the stressing signal S_stress to the MOS transistor. According to the measured current or other characteristics, the degradation information of the MOS transistor is obtained.

According to the degradation information, the total degradation Dt is obtained. When the stressing signal S_stress with the voltage level V1 is applied to the device from time T0 to time T1, the total degradation Dt increases over time. At time T1, the stress signal S_stress is changed from the voltage level V1 to the voltage level V0, and then the total degradation Dt decreases over time.

As described above, the total degradation Dt can be partitioned into a permanent degradation portion and an impermanent degradation portion. For the total degradation Dt of FIG. 2, the permanent degradation portion includes an unrecoverable degradation Dp, and the impermanent degradation portion includes a recoverable degradation Df.

In some embodiments, the unrecoverable degradation Dp is known according to at least one function of degradation and the degradation information of the measured device, and the parameters of the function are determined according to the process parameters provided by a wafer fabrication facility. Thus, by removing or subtracting the unrecoverable degradation Dp from the total degradation Dt, the recoverable degradation Df is obtained. Furthermore, the unrecoverable degradation Dp will only increase and will not be reduced for the device.

Referring back to the flowchart of FIG. 1, after obtaining the impermanent degradation portion (e.g., the recoverable degradation Df of FIG. 2), the impermanent degradation portion is differentiated by time to obtain a differential value corresponding to the operating condition (operation S130).

By changing or adjusting the operating condition, the differential value corresponding to the changed operating condition is obtained. Thus, according to the differential values corresponding to various operating conditions and balance points for the degradation Df, the aging model of the device is obtained (operation S140). The balance points will be described in detail below.

FIG. 3A shows an exemplified diagram illustrating the unrecoverable degradation Dp of a device, and the unrecoverable degradation Dp is obtained according to the degradation information under a second operating condition Cond2, in accordance with some embodiments of the disclosure. In the second operating condition Cond2, a stressing signal S_stress with a voltage value V2 is applied to the device from time T0 to time T1, and then the stressing signal S_stress with a voltage value V1 is applied to the device from time T1 to time T2. Next, the stressing signal S_stress with a voltage value V2 is applied to the device after time T2. The voltage value V1 is greater than the voltage value V0, and the voltage value V2 is greater than the voltage value V1. In response to the stressing signal S_stress, the device is measured. In FIG. 3A, the unrecoverable degradation Dp is obtained according to at least one function of degradation.

The recoverable degradation Df includes a stress degradation Dfs corresponding to a degradation mechanism and a recovery degradation Dfr corresponding to a recovery mechanism.

FIG. 3B shows an exemplified diagram illustrating the stress degradation Dfs of the recoverable degradation Df, and the stress degradation Dfs is obtained according to the degradation information of a device under a third operating condition Cond3, in accordance with some embodiments of the disclosure. In the third operating condition Cond3, a stressing signal S_stress with a voltage value V0 is applied to the device from time T0 to time T1, and then the stressing signal S_stress with a voltage value V1 is applied to the device after time T1. The voltage value V1 is greater than the voltage value V0. In response to the stressing signal S_stress, the device is measured and the stress degradation Dfs is obtained by subtracting the unrecoverable degradation Dp from the total degradation Dt of the degradation information for the measured device (not shown). Furthermore, after a long time (e.g., T2>>T1), the stress degradation Dfs corresponding to the stressing signal S_stress with the voltage value V1 will reach a steady state where a balance point Db(V1) is obtained. Furthermore, the stress degradation Dfs increases over time.

FIG. 3C shows an exemplified diagram illustrating the recovery degradation Dfr of the recoverable degradation Df, and the recovery degradation Dfr is obtained according to the degradation information of a device under a fourth operating condition Cond4, in accordance with some embodiments of the disclosure. In the fourth operating condition Cond4, a stressing signal S_stress with a voltage value V3 is applied to the device from time T0 to time T1, and then the stressing signal S_stress with a voltage value V2 is applied to the device after time T1. The voltage value V3 is greater than the voltage value V2. In response to the stressing signal S_stress, the device is measured and the recovery degradation Dfr is obtained by subtracting the unrecoverable degradation Dp from the total degradation Dt of the degradation information for the measured device. Furthermore, after a long time (e.g., T2>>T1), the recovery degradation Dfr corresponding to the stressing signal S_stress with the voltage value V2 will reach a steady state where a balance point Db(V2) is obtained. Furthermore, the recovery degradation Dfr decreases over time.

When the degradation rate of the stress degradation Dfs and the recovery rate of the recovery degradation Dfr are the same, the degradation Df is at a balance point Db. By adjusting the voltage level of the stress signal S_stress, a relationship between the balance point Db and the voltage level of the stress signal S_stress is obtained, and then the aging model of the device is obtained according to the degradation Df and the balance point Db corresponding to each voltage level of the stress signal S_stress.

In BTI, degradation and recovery mechanisms both exist and will cancel each other out for the degradation information. It is found that degradation (or recovery) rate is a function of degradation as well as biases. For a given bias, there exists a balance point Db with a net degradation, where dDb/dt=0 (i.e., degradation and recovery rates are the same).

Figures 4A, 4B:
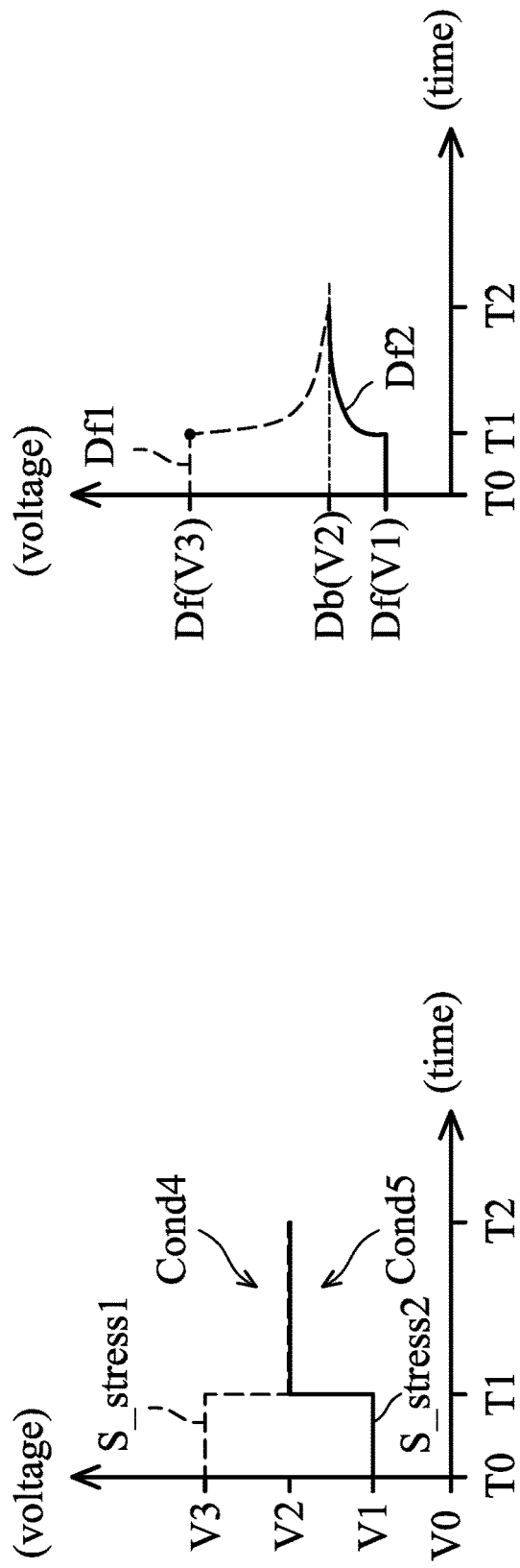
FIG. 4A shows an exemplified diagram illustrating a first stressing signal of a fourth operating condition and a second stressing signal of a fifth operating condition, in accordance with some embodiments of the disclosure.
FIG. 4B shows an exemplified diagram illustrating a first recoverable degradation corresponding to the first stressing signal of FIG. 4A and a second recoverable degradation corresponding to the second stressing signal of FIG. 4A, in accordance with some embodiments of the disclosure.

FIG. 4A shows an exemplified diagram illustrating a first stressing signal S_stress1 of a fourth operating condition Cond4 and a second stressing signal S_stress2 of a fifth operating condition Cond5, in accordance with some embodiments of the disclosure. In the fourth operating condition Cond4, the first stressing signal S_stress1 with a voltage value V3 is applied to the device from time T0 to time T1, and then the first stressing signal S_stress1 with a voltage value V2 is applied to the device after time T1. In the fifth operating condition Cond5, the second stressing signal S_stress2 with a voltage value V1 is applied to the device from time T0 to time T1, and then the second stressing signal S_stress2 with a voltage value V2 is applied to the device after time T1. The voltage value V2 is greater than the voltage value V1, and the voltage value V3 is greater than the voltage value V2.

FIG. 4B shows an exemplified diagram illustrating a first recoverable degradation Df1 corresponding to the first stressing signal S_stress1 of FIG. 4A and a second recoverable degradation Df2 corresponding to the second stressing signal S_stress2 of FIG. 4A, in accordance with some embodiments of the disclosure. At time T1, the degradation value of the first recoverable degradation Df1 is Df(V3), and the degradation value of the second recoverable degradation Df2 is Df(V1). After a long time (e.g., T2>>T1), the first recoverable degradation Df1 reach a steady state from the degradation value Df(V3) to Db(V2), and the second recoverable degradation Df2 also reach the steady state from the degradation value Df(V1) to Db(V2). In the steady state, the degradation and recover rates are the same, and a balance point is reached for the first recoverable degradation Df1 and the second recoverable degradation Df2. In response to the voltage value V of a stressing signal, it is determined that the device is operating in a stress state or a recovery state according to the degradation value and the balance point corresponding to the voltage value V. For example, if the degradation value Df(V) is greater than the balance point Db(V), the device is operating in a recovery state. Conversely, if the degradation value Df(V) is less than the balance point Db(V), the device is operating in a stress state. The stress state and the recovery state will be described in detail below.

Figure 5B:
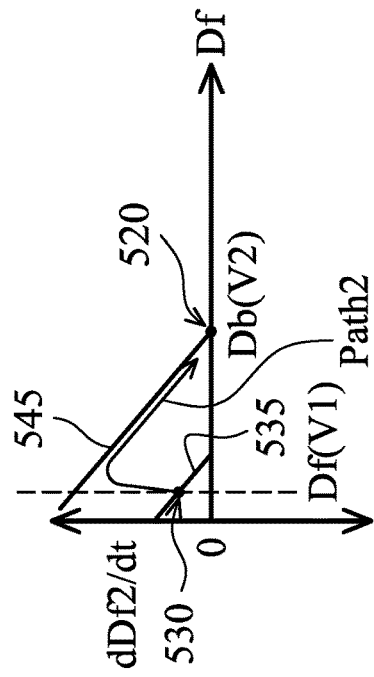
FIG. 5B shows an exemplified diagram illustrating an aging model having a relationship between the second recoverable degradation of FIG. 4B and a second differential value, in accordance with some embodiments of the disclosure.
Figure 5A:
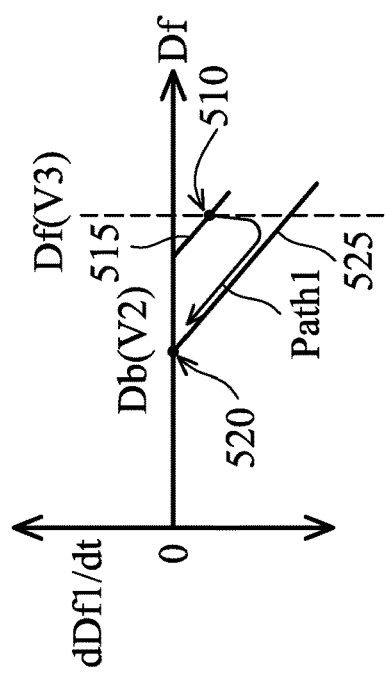
FIG. 5A shows an exemplified diagram illustrating an aging model having a relationship between the first recoverable degradation of FIG. 4B and a first differential value, in accordance with some embodiments of the disclosure.

FIG. 5A shows an exemplified diagram illustrating an aging model having a relationship between the first recoverable degradation Df1 of FIG. 4B and a first differential value dDf1/dt, in accordance with some embodiments of the disclosure. As described above, the first differential value dDf1/dt is obtained by differentiating the first recoverable degradation Df1 by time. Referring to FIG. 4B and FIG. 5A together, when the first recoverable degradation Df1 is changed from Df(V3) to Db(V2) in FIG. 4B, the first differential value dDf1/dt is changed from a node 510 corresponding to the degradation value Df(V3) in an oblique line 515 to a node 520 corresponding to the degradation value Db(V2) in an oblique line 525 through a path Path1, In some embodiments, the node 520 is substantially close to zero, and the node 520 represents a differential value corresponding to the balance point of the voltage value V2 (e.g. Db(V2)). Due to the first differential value dDf1/dt is less than zero in the path Path1 (i.e., the first differential value dDf1/dt has a negative value), the device is operating in a recovery state under the fourth operating condition. In the recovery state, the degradation value Df1 decreases over time for the device until the degradation value Df1 reach the balance point, as shown in FIG. 4B. Specifically, for a stressing signal with a voltage value V that is applied to a device, the device is operating in a recovery state when the degradation value Df(V) is greater than the balance point Db(V). Furthermore, slopes of the oblique lines 515 and 525 of the aging model are obtained according to the degradation information measured from the device by using the method of FIG. 1. In some embodiments, each of the oblique lines 515 and 525 has individual slope.

FIG. 5B shows an exemplified diagram illustrating an aging model having a relationship between the second recoverable degradation Df2 of FIG. 4B and a second differential value dDf2/dt, in accordance with some embodiments of the disclosure. As described above, the second differential value dDf2/dt is obtained by differentiating the second recoverable degradation Df2 by time. Referring to FIG. 4B and FIG. 5B together, when the second recoverable degradation Df2 is changed from Df(V1) to Db(V2) in FIG. 4B, the second differential value dDf2/dt is changed from a node 530 corresponding to the degradation value $D_f(V1)$ in an oblique line 535 to a node 520 corresponding to the degradation value Db(V2) in an oblique line 545 through a path Path2, and the node 520 is substantially close to zero. Due to the second differential value dDf2/dt is greater than zero in the path Path2 (i.e., the second differential value dDf2/dt has a positive value), the device is operating in a stress state under the fifth operating condition. In the stress state, the degradation value Df2 increases over time for the device until the degradation value Df1 reach the balance point, as shown in FIG. 4B. Specifically, for a stressing signal with a voltage value V that is applied to a device, the device is operating in a stress state when the degradation value Df(V) is less than the balance point Db(V). Furthermore, slopes of the oblique lines 535 and 545 of the aging model are obtained according to the degradation information measured from the device by using the method of FIG. 1. In some embodiments, each of the oblique lines 535 and 545 has individual slope.

In some embodiments, the oblique line 525 of FIG. 5A and the oblique line 545 of FIG. 5B both corresponding to the node 520 are the same line, i.e., slopes of the oblique lines 525 and 545 are the same.

In some embodiments, the oblique line 525 of FIG. 5A and the oblique line 545 of FIG. 5B both corresponding to the node 520 are different lines, i.e., slopes of the oblique lines 525 and 545 are different.

Figure 6A:
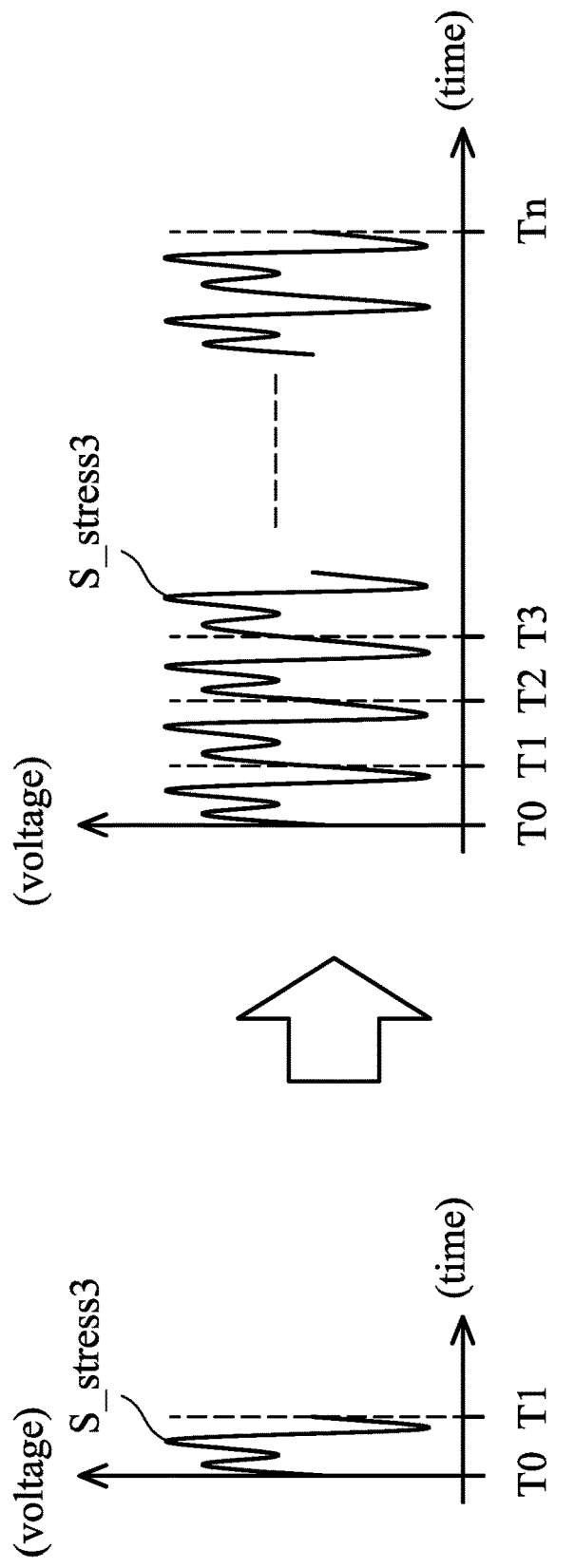
FIG. 6A shows an exemplified diagram illustrating a third stressing signal, in accordance with some embodiments of the disclosure.

FIG. 6A shows an exemplified diagram illustrating a third stressing signal S_stress3, in accordance with some embodiments of the disclosure. The third stressing signal S_stress3 is applied to a device from time T0 to time T1, and then the degradation information is measured. According to a short time interval between time T0 and time T1, the piecewise waveform of third stressing signal S_stress3 between time T0 and time T1 is repeated to obtain the third stressing signal S_stress3 in a long time interval between time T0 and time Tn. Thus, a new third stressing signal S_stress3 for a long time (e.g., 3 years) is obtained according to the piecewise third stressing signal S_stress3 for a short time (e.g., 1 week).

Figure 6B:
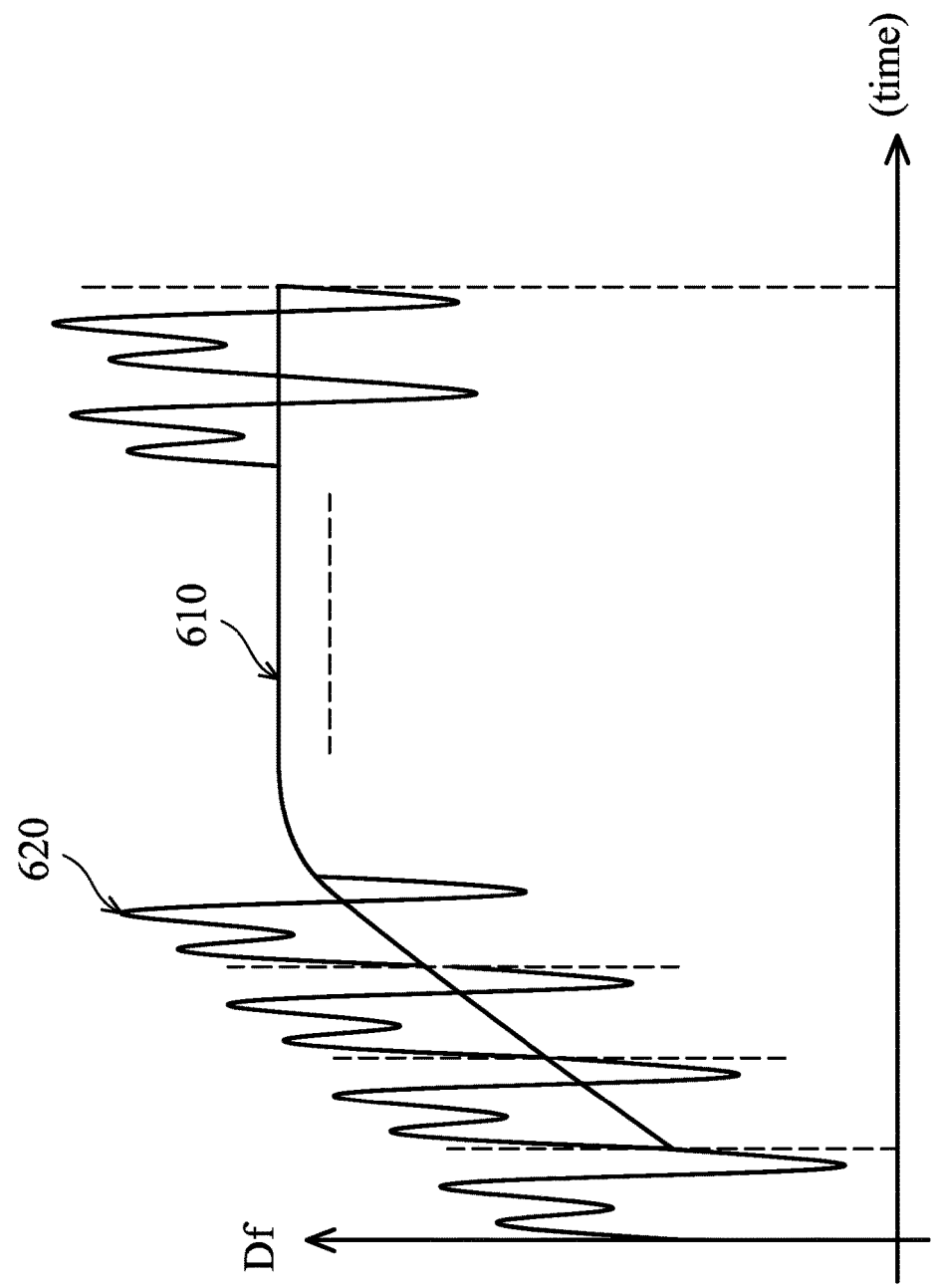
FIG. 6B shows an exemplified diagram illustrating a recoverable degradation corresponding to the new third stressing signal of FIG. 6A, in accordance with some embodiments of the disclosure.

FIG. 6B shows an exemplified diagram illustrating a recoverable degradation Df corresponding to the new third stressing signal S_stress3 of FIG. 6A, in accordance with some embodiments of the disclosure. In FIG. 6B, the recoverable degradation Df is obtained according to the degradation (labeled as 620) corresponding to the new third stressing signal S_stress3 and a degradation factor (labeled as 610). In some embodiments, the degradation factor 610 is obtained according to process parameters provided by a wafer fabrication facility. Thus, by using the degradation information measured in a short time, the degradation information estimated in a long time is obtained, and then an aging model for a long time is established according to the degradation information.

Figure 7:
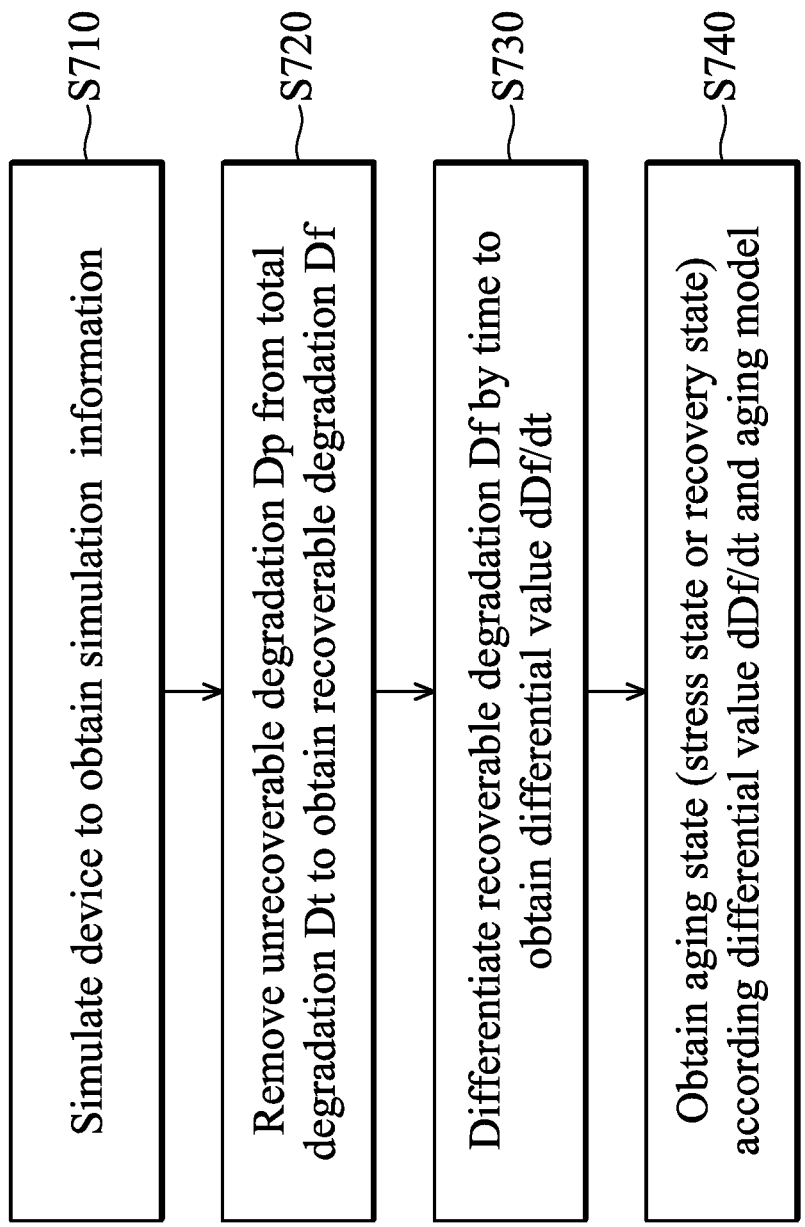
FIG. 7 shows a simplified flowchart illustrating a method for analyzing the aging state of a device, in accordance with some embodiments of the disclosure.

FIG. 7 shows a simplified flowchart illustrating a method for analyzing the aging state of a device, in accordance with some embodiments of the disclosure. In some embodiments, the method of FIG. 7 is performed by a processor capable of executing a simulation tool.

In operation S710, a device under design is simulated by a simulation tool according to a simulation signal S_sim, so as to obtain simulation information. In some embodiments, the simulation tool simulates the device under design according to various simulation data, e.g., netlist of the device, mode parameter, time, voltage and so on. Furthermore, size and characteristics (e.g., oxide thickness, operation frequency, operation voltage, temperature, etc.) of the device under design will be analyzed to obtain the simulation information. In some embodiments, the voltage level of the simulation signal S_sim is changing with time, and the simulation information is used to obtain the degradation information of the device for prediction. In some embodiments, the device under design is an active or passive component (e.g., a MOS transistor, a resistor, a capacitor, etc.) that forms the circuit (e.g., a digital circuit, an analog circuit, a memory circuit, etc.) of an IC.

After obtaining the simulation information of the device (in operation S710), total degradation Dt is obtained or extracted from the simulation information. As described above, the total degradation Dt can be partitioned or divided into a permanent degradation portion and an impermanent degradation portion. For the total degradation Dt, the permanent degradation portion includes an unrecoverable degradation Dp, and the impermanent degradation portion includes a recoverable degradation Df, i.e. Dt=Dp+Df.

In operation S720, by removing the unrecoverable degradation Dp from the total degradation Dt, the recoverable degradation Df is obtained. After obtaining the recoverable degradation Df, the recoverable degradation Df is differentiated by time to obtain a differential value dDf/dt (operation S730) corresponding to the simulation signal S_sim.

In operation S740, by tracking the position of the differential value dDf/dt in an aging model obtained in the method of FIG. 1, an estimated trend path illustrating the aging state of the device under design is obtained. The estimated trend path represents that the device under design is operating in a stress state or a recovery state at an estimated time. For example, the device under design will operate in which state (e.g., the stress state or the recovery state) after two years.

In some embodiments, it is determined that the device under design is operating in a stress state or a recovery state according to the recoverable degradation Df(V) corresponding to a voltage value V of the simulation signal S_sim and a balance point Db(V) corresponding to the voltage value V. For example, if the degradation value Df(V) is greater than the balance point Db(V), the device under design is operating in a recovery state. Conversely, if the degradation value Df(V) is less than the balance point Db(V), the device under design is operating in a stress state.

If the estimated trend path conforms to design or aging requirements for the device under design, a wafer including the device under design is fabricated. Conversely, if the estimated trend path does not conform to design requirements of the device under design, the size or characteristics of the device under design is modified. Next, the modified device is analyzed again until the estimated trend path conforms to design requirements for the device.

Figures 8A, 8B:
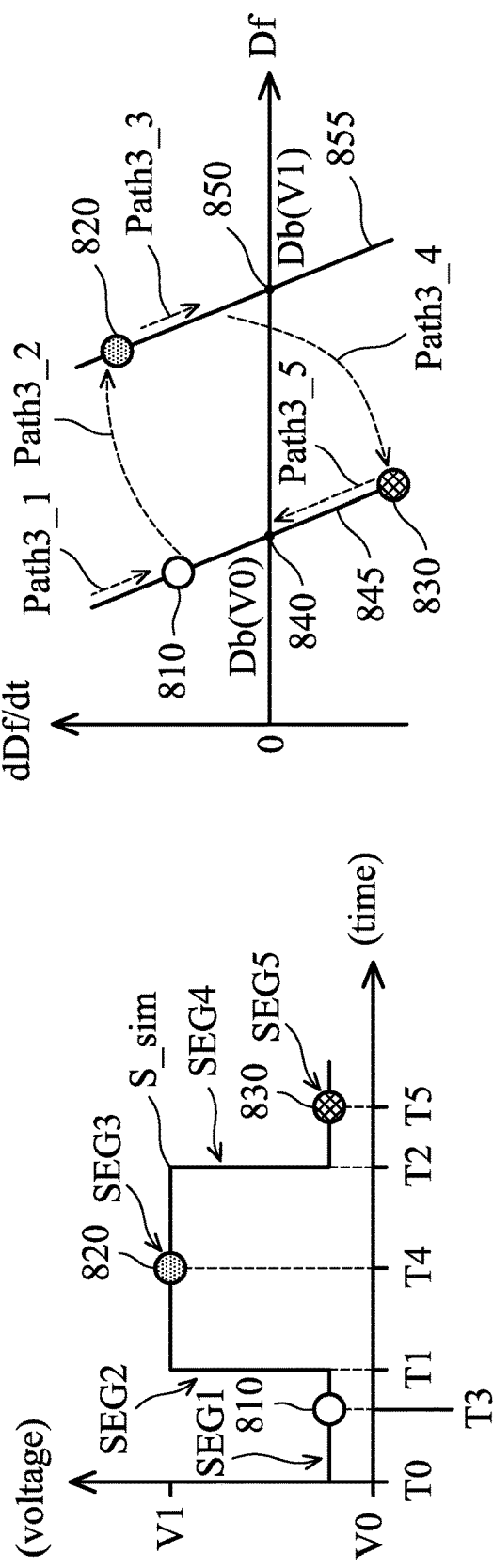
FIG. 8A shows an exemplified diagram illustrating a simulation signal for analyzing the aging state of a device, in accordance with some embodiments of the disclosure.
FIG. 8B shows an exemplified diagram illustrating an aging model having a relationship between the recoverable degradation corresponding to the simulation signal of FIG. 8A and a differential value, in accordance with some embodiments of the disclosure.

FIG. 8A shows an exemplified diagram illustrating a simulation signal S_sim for analyzing the aging state of a device, in accordance with some embodiments of the disclosure. In FIG. 8A, a waveform of the simulation signal S_sim is divided into five segments SEG1 to SEG5. In the segment SEG1, the simulation signal S_sim has a voltage value V0 from time T0 to time T1. In the segment SEG2, the simulation signal S_sim is changed from the voltage value V0 to the voltage value V1 at time T1. In the segment SEG3, the simulation signal S_sim has the voltage value V1 from time T1 to time T2. In the segment SEG4, the simulation signal S_sim is changed from the voltage value V1 to the voltage value V0 at time T2. In the segment SEG5, the simulation signal S_sim has the voltage value V0 after time T2. Furthermore, a node 810 represents the simulation signal S_sim with the voltage value V0 at time T3, a node 820 represents the simulation signal S_sim with the voltage value V1 at time T4, and a node 830 represents the simulation signal S_sim with the voltage value V0 at time T5. As described above, in response to the simulation signal S_sim of FIG. 8A, the recoverable degradation Df corresponding to the simulation signal S_sim can be obtained.

FIG. 8B shows an exemplified diagram illustrating an aging model having a relationship between the recoverable degradation Df corresponding to the simulation signal S_sim of FIG. 8A and a differential value dDf/dt, in accordance with some embodiments of the disclosure. As described above, the differential value dDf/dt is obtained by differentiating the recoverable degradation Df by time. Referring to FIG. 8A and FIG. 8B together, when the simulation signal S_sim is changed from the segment SEG1 to the segment SEG3 through the segment SEG 2 in FIG. 8A, the differential value dDf/dt is changed from a path Path3_1 corresponding to the segment SEG1 to a path Path3_3 corresponding to the segment SEG3 through a path Path3_2 corresponding to the segment SEG2. Due to the differential value dDf/dt is greater than zero in the paths Path3_1, path3_2 and Path3_3 (i.e. the degradation value Df is less than the balance point), analysis indicates that the device under design is operating in a stress state. As described above, in the stress state, the degradation mechanism is stronger than the recovery mechanism, thus the degradation value Df is increased and the differential value dDf/dt corresponding to the degradation value Df will move along an oblique line 855 until it reaches the degradation value Db(V1) (labeled as 850).

When the simulation signal S_sim is changed from the segment SEG3 to the segment SEG5 through the segment SEG 4 in FIG. 8A, the differential value dDf/dt is changed from the path Path3_3 corresponding to the segment SEG3 to a path Path3_5 corresponding to the segment SEG5 through a path Path3_4 corresponding to the segment SEG4. Due to the differential value dDf/dt is less than zero in the paths Path3_4 and Path3_5 (i.e. the degradation value Df is greater than the balance point), analysis indicates that the device under design is operating in a recovery state. As described above, in the recovery state, the recovery mechanism is stronger than the degradation mechanism, thus the degradation value Df is decreased and the differential value dDf/dt corresponding to the degradation value Df will move along an oblique line 845 until it reaches the degradation value Db(V0) (labeled as 840).

According to an estimated trend path formed by the paths Path3_1, Path3_2, Path3_3, Path3_4 and Path3_5, it is determined whether the device under design is operating in the stress state or the recovery state at an estimated time.

For the nodes 810 and 830, although the simulation signal S_sim are the same, the device under design corresponding to the node 810 is operating in a stress state, and the device under design corresponding to the node 830 is operating in a recovery state. Specifically, with the different times (e.g., T3 and T5), even if the simulation signal S_sim is the same, the aging states of the device under design are different.

If the estimated trend path conforms to design requirements for the device under design, a wafer including the device under design is fabricated. Conversely, if the estimated trend path does not conform to design requirements of the device under design, the size or characteristics of the device under design is modified until the estimated trend path conforms to design requirements for the device.

Figure 9:
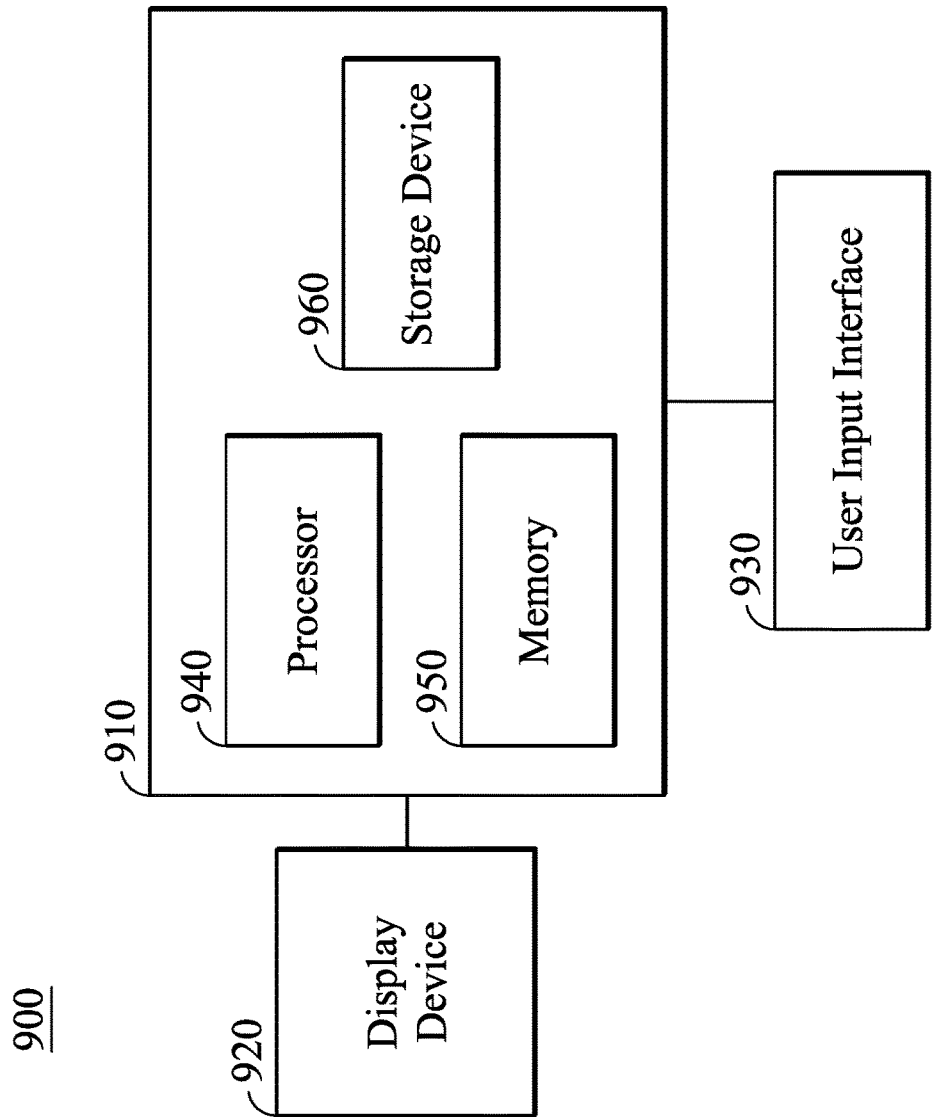
FIG. 9 shows a computer system, in accordance with some embodiments of the disclosure.

FIG. 9 shows a computer system 900, in accordance with some embodiments of the disclosure. The computer system 900 includes a computer 910, a display device 920 and a user input interface 930, wherein the computer 910 includes a processor 940, a memory 950, and a storage device 960. The computer 910 is coupled to the display device 920 and the user input interface 930, wherein the computer 910 is capable of operating simulation tool to perform the placement methods of FIG. 1 and FIG. 7. Furthermore, the computer 910 is capable of receiving the information regarding the device to be measured and the device under design. In some embodiments, the display device 920 is a GUI for the computer 910. Furthermore, the display device 920 and the user input interface 930 can be implemented in the computer 910. The user input interface 930 may be a keyboard, a mouse and so on. In the computer 910, the storage device 960 can store the operating systems (OSs), applications, and data that include input required by the applications and/or output generated by applications. The processor 940 of the computer 910 can perform one or more operations (either automatically or with user input) in any method that is implicitly or explicitly described in this disclosure. Furthermore, during operation, the processor 940 can load the applications of the storage device 960 into the memory 950, and then the applications can be used to create, view, and/or edit the aging model for IC design.

Embodiments of methods for establishing an aging model of a device and for analyzing the aging state of a device are provided. According to the embodiments, a recovery effect is modeled in the aging model. In the aging model, if the differential value dDf/dt is greater than zero (i.e., the degradation Df of the device is less than the balance point), the device is operating in a stress state. Conversely, if the differential value dDf/dt is less than zero (i.e., the degradation Df of the device is greater than the balance point), the device is operating in a recovery state. Thus, under arbitrary waveform (e.g. frequency, duty cycle, or voltage level of the simulation signal S_sim is variable) for simulation, the recovery time corresponding to the recovery state and the time corresponding to the stress state can be automatically and accurately calculated for IC design. Therefore, the design margin of the device under design can avoid underestimating or overestimating.

In some embodiments, a method for establishing an aging model of a device is provided. The device is measured to obtain degradation information of the device under an operating condition, wherein the device is a physical device. The degradation information is partitioned into a permanent degradation portion and an impermanent degradation portion. The impermanent degradation portion is differentiated by time to obtain a differential value. The aging model is obtained according to the differential value. When the differential value is greater than zero, degradation of the device increases over time, and when the differential value is less than zero, the degradation of the device decreases over time.

In some embodiments, a method for analyzing the aging state of a device is provided. An aging model of the device is obtained. The device is simulated according to a simulation voltage that changes over time, to obtain simulation information. An unrecoverable degradation portion is removed from the simulation information to obtain a recoverable degradation portion. The recoverable degradation portion is differentiated by time to obtain a first differential value. It is determined whether the device is operating in a stress state or a recovery state according to the first differential value in the aging model of the device.

In some embodiments, a method for analyzing the aging state of a device is provided. The device is simulated according to a simulation voltage that changes over time, to obtain simulation information. The simulation information is partitioned into an unrecoverable degradation portion and a recoverable degradation partition. The recoverable degradation portion is differentiated by time to obtain a first differential value. It is determined that the device is operating in a stress state when the first differential value corresponding to the simulation voltage with a voltage value is greater than a differential value corresponding to a balance point of the voltage value. It is determined that the device is operating in a recovery state when the first differential value corresponding to the simulation voltage with the voltage value is less than the differential value corresponding to the balance point of the voltage value.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for establishing an aging model of a device, the method comprising:
    measuring the device to obtain degradation information of the device under an operating condition, wherein the device is a physical device;
    partitioning the degradation information into a permanent degradation portion and an impermanent degradation portion;
    differentiating the impermanent degradation portion by time to obtain a differential value; and
    obtaining the aging model according to the differential value,
    wherein when the differential value is greater than zero, a degradation of the device increases over time, and when the differential value is less than zero, the degradation of the device decreases over time.

2. The method as claimed in claim 1, further comprising:
    analyzing a device under design according to the aging model to obtain degradation of the analyzed device; and
    fabricating a wafer comprising the analyzed device when an analysis indicates that the degradation of the analyzed device conforms to design requirements for the analyzed device.

3. The method as claimed in claim 1, wherein when the differential value is substantially close to zero, a balance point in the degradation of the device corresponding to the operating condition is obtained.

4. The method as claimed in claim 3, wherein when a stressing signal is applied to the device from a first voltage level to a second voltage level after a first time point under the operating condition, the degradation of the device reaches the balance point, wherein the first voltage level is greater than the second voltage level.

5. The method as claimed in claim 4, wherein when the stressing signal is applied to the device from a third voltage level to the second voltage level after a second time point under the operating condition, the degradation of the device reaches the balance point, wherein the second voltage level is greater than the third voltage level.

6. The method as claimed in claim 1, wherein the permanent degradation portion of the degradation information comprises an unrecoverable degradation of the device, and the impermanent degradation portion of the degradation information comprises a recoverable degradation of the device.

7. A method for analyzing an aging state of a device, the method comprising:
    obtaining an aging model of the device;
    simulating the device according to a simulation voltage that changes over time, to obtain simulation information;
    removing an unrecoverable degradation portion from the simulation information to obtain a recoverable degradation portion; and
    determining whether the device is operating in a stress state or a recovery state according to the recoverable degradation portion corresponding to the simulation voltage with a voltage value and a balance point corresponding to the voltage value in the aging model of the device.

8. The method as claimed in claim 7, further comprising:
    fabricating a wafer comprising the device when the device is operating in the stress state or the recovery state that conforms to design requirements of the device.

9. The method as claimed in claim 8, wherein the determining whether the device is operating in the stress state or the recovery state according to the recoverable degradation portion corresponding to the simulation voltage with the voltage value and the balance point corresponding to the voltage value in the aging model of the device further comprises:
    determining the device is operating in the stress state when the recoverable degradation portion corresponding to the simulation voltage with the voltage value is less than the balance point corresponding to the voltage value in the aging model of the device; and
    determining the device is operating in the recovery state when the recoverable degradation portion corresponding to the simulation voltage with the voltage value is greater than the balance point corresponding to the voltage value in the aging model of the device.

10. The method as claimed in claim 8, wherein the obtaining the aging model of the device comprises:
    measuring a physical device to obtain degradation information of the physical device under a plurality of operating conditions;
    partitioning the degradation information into a permanent degradation portion and an impermanent degradation portion for each operating condition of the plurality of operating conditions;
    differentiating the impermanent degradation portion by time to obtain a first differential value for each operating condition of the plurality of operating conditions; and
    establishing the aging model according to the first differential value,
    wherein when the first differential value is greater than zero, a degradation of the physical device increases over time, and when the first differential value is less than zero, the degradation of the physical device decreases over time.

11. The method as claimed in claim 10, wherein when the first differential value is substantially close to zero, an individual balance point of the device is obtained for each operating condition of the plurality of operating conditions in the aging model of the device.

12. The method as claimed in claim 11, wherein when a stressing signal is applied to the physical device from a first voltage level to a second voltage level after a first time point in each operating condition of the plurality of operating conditions, the degradation of the physical device reaches the individual balance point for the each operating condition, wherein the first voltage level is greater than the second voltage level.

13. The method as claimed in claim 12, wherein when the stressing signal is applied to the physical device from a third voltage level to the second voltage level after a second time point in each operating condition of the plurality of operating conditions, the degradation of the physical device reaches the balance point for the each operating condition, wherein the second voltage level is greater than the third voltage level.

14. The method as claimed in claim 7, further comprising:
differentiating the recoverable degradation portion by time to obtain a second differential value;
determining the device is operating in the stress state when the second differential value corresponding to the simulation voltage with the voltage value is greater than a differential value of the balance point corresponding to the voltage value; and
determining the device is operating in the recovery state when the second differential value corresponding to the simulation voltage with the voltage value is less than the differential value of the balance point corresponding to the voltage value.

15. A method for analyzing an aging state of a device, the method comprising:
simulating the device according to a simulation voltage that changes over time, to obtain simulation information;
partitioning the simulation information into an unrecoverable degradation portion and a recoverable degradation portion;
differentiating the recoverable degradation portion by time to obtain a first differential value;
determining the device is operating in a stress state when the first differential value corresponding to the simulation voltage with a voltage value is greater than a differential value corresponding to a balance point of the voltage value; and
determining the device is operating in a recovery state when the first differential value corresponding to the simulation voltage with the voltage value is less than the differential value corresponding to the balance point of the voltage value.

16. The method as claimed in claim 15, further comprising:
fabricating a wafer comprising the device when the device is operating in the stress state or the recovery state that conforms to design requirements of the device.

17. The method as claimed in claim 15, wherein the simulating the device according to the simulation voltage that changes over time, to obtain the simulation information further comprises:
repeating a piecewise simulation voltage of a first time period to obtain a repeated simulation voltage of a second time period, wherein the second time period is greater than the first time period,
wherein the recoverable degradation portion is obtained according to the repeated simulation voltage and a degradation factor.

18. The method as claimed in claim 15, further comprising:
determining the device is operating in the balance point of the voltage value when the first differential value corresponding to the simulation voltage with the voltage value is substantially close to zero.

19. The method as claimed in claim 18, wherein when the simulation voltage is changed from a first voltage level to a second voltage level after a first time point, the device reaches a balance point corresponding to the second voltage level, wherein the first voltage level is greater than the second voltage level.

20. The method as claimed in claim 19, wherein when the simulation voltage is changed from a third voltage level to the second voltage level after a second time point, the device reaches the balance point corresponding to the second voltage level, wherein the second voltage level is greater than the third voltage level.

* * * * *